United States Patent [19]

Ogiwara

[11] 4,344,260
[45] Aug. 17, 1982

[54] METHOD FOR PRECISION SHAPING OF WAFER MATERIALS

[75] Inventor: Kesami Ogiwara, Nagano, Japan

[73] Assignees: Nagano Electronics Industrial Co., Ltd.; Shin-Etsu Chemical Co., Ltd., both of Japan

[21] Appl. No.: 165,191

[22] Filed: Jul. 1, 1980

[30] Foreign Application Priority Data

Jul. 13, 1979 [JP] Japan .................................. 54-89146
Oct. 26, 1979 [JP] Japan ................................ 54-138308

[51] Int. Cl.$^3$ .............................................. B24B 1/00
[52] U.S. Cl. .................................................. 51/283 E
[58] Field of Search ......................... 51/283 R, 283 E; 125/13 R

[56] References Cited

U.S. PATENT DOCUMENTS 2,693,063 11/1954 Dillon ............................... 51/284 E
3,628,294 12/1971 Sattler .................................... 51/283
4,084,354 4/1978 Grandia ............................ 51/283 R Primary Examiner—Harold D. Whitehead
Attorney, Agent, or Firm—Hopgood, Calimafde, Kalil, Blaustein & Judlowe

[57] ABSTRACT

The invention provides a novel and efficient apparatus for shaping wafer materials of exact dimensions from a single crystal rod. Different from the conventional procedure, the single crystal rod is first ground to have a cross section larger than the desired wafer by a margin to grind and then sliced into margined wafers and the margined wafer is subjected to contour grinding tracing a prototype of the desired wafer. The invention also provides an apparatus for the above process, with which the margined wafer can be not only ground to the exact diameter and outer shape but also chamfered at the peripheral edges successively by a single mounting on the apparatus.

1 Claim, 2 Drawing Figures

METHOD FOR PRECISION SHAPING OF WAFER MATERIALS

BACKGROUND OF THE INVENTION

The present invention relates to a method for precision shaping of wafer materials or, more particularly, to a novel and improved method for shaping wafer materials such as silicon semiconductor wafers used in electronics industries with high dimensional precision and high production efficiency.

As is well known, various kinds of single crystal materials are widely used in electronics industries such as high-purity silicon and germanium as a semiconductor material and gadolinium gallium garnet (hereinafter abbreviated as GGG) as a magnetic bubble-memory device in computers. These single crystal materials are usually used in a form of very tiny chips. Such tiny chips of single crystal materials are prepared by first slicing a rod-like so-called ingot or boule of the single crystal as grown into wafers of a thickness of several tenths of a millimeter and then cutting the wafers into chips.

Along with the progress in the electronics technology, requirements for the dimensional accuracy of these materials are growing more and more in order not only to facilitate the quality control of the finished electronic devices but also to improve the production efficiency. For example, the diameter of wafer materials as is required to be controlled within ±0.2 mm or, preferably, within ±0.1 mm. In addition, it is a common practice in handling of wafer materials that circular wafers are provided with one or more of so-called orientation flats to facilitate mounting of them on a cutting machine. An orientation flat is a portion of straight periphery obtained by cutting off a crescent-shaped portion from a circular wafer.

The conventional procedure for shaping wafer materials satisfying the above mentioned requirements both in dimensional accuracy and shape is first to grind the rod-like ingot or boule of the single crystal until the rod has a cross section exactly in conformity with the shape and dimensions of the finished wafers and then to slice the thus ground rod into wafers on a slicing machine.

The above described process for wafer shaping has problems in several aspects. Firstly, as is often the case when the direction of the crystallographic axis in the wafer is of utmost importance, the plane of slicing is not always exactly perpendicular to the axis of the single crystal rod according to particular needs in the crystallographic orientation of the finished wafers. In such a biased slicing, the wafer as sliced is no longer circular but elliptical so that the difference in the lengths of the longer and shorter axes sometimes exceeds the permissible error in the diameter of the circular wafers. Assume that, for example, the single crystal rod has a diameter of 100 mm and the plane of slicing is biased by 4° from the plane perpendicular to the rod axis, then the longer axis of the elliptical wafer as sliced is about 0.2 mm longer than the shorter axis so that the maximum permissible error of ±0.2 mm is unavoidably exceeded in principle.

Secondly, due to the brittleness of single crystal materials in general, chipping of the wafer edges takes place frequently in the step of slicing badly decreasing the productivity since such a chipped wafer is no longer acceptable as a commercial product.

Thirdly, some users of the wafer materials require that each of the wafers is chamfered at the periphery so as to avoid accidental chipping of the wafers in their handling. This step of wafer by wafer chamfering is very time-consuming.

SUMMARY OF THE INVENTION

Thus, an object of the present invention is to provide a novel and improved method for shaping wafer materials from a rod-like single crystal with high precision and high productivity.

Another object of the present invention is to provide a method in which wafer materials of high dimensional accuracy can be shaped from a single crystal rod even when the plane of slicing is biased from the plane perpendicular to the axis of the rod.

A further object is to provide a method in which chamfering of the wafer edges can be performed in a single arrangement with the step of shaping the exact wafer diameter.

A still further object of the invention is to provide a novel apparatus for practicing the above described method.

The method of the invention for shaping a wafer material with accurate dimensions from a single crystal rod comprises the steps of:

(a) grinding the single crystal rod so as that the rod has a cross section larger by a margin to grind than the wafer material to be finished, (b) slicing the single crystal rod into wafers, and (c) subjecting the wafer to contour grinding tracing a prototype having a cross section exactly in conformity with the wafer to be finished.

The step (c) of the above described method of the invention is most efficiently practiced with an apparatus which comprises (a) a chucking holder rotating around an axis holding a wafer material in such a disposition that the plane of the wafer material is perpendicular to the axis of rotation, (b) a prototype of the wafer to be finished having exactly the same cross section as the wafer to be finished and rotating coaxially with the chucking holder at the same velocity, and (c) a tracing grinder unit rotating around an axis which is parallel with the axis of the chucking holder and capable of relatively moving toward and away from the axis of the chucking holder and provided with a tracer roller and a grinder wheel having a diameter equal to the tracer roller in such a manner that the tracer roller comes to contact with the prototype and the grinder wheel comes to contact with the wafer material held by the chucking holder when the tracing grinder unit is moved toward the chucking holder and the prototype.

DETAILED DESCRIPTION OF THE PREFERRED EMBODIMENTS

Figure 1:
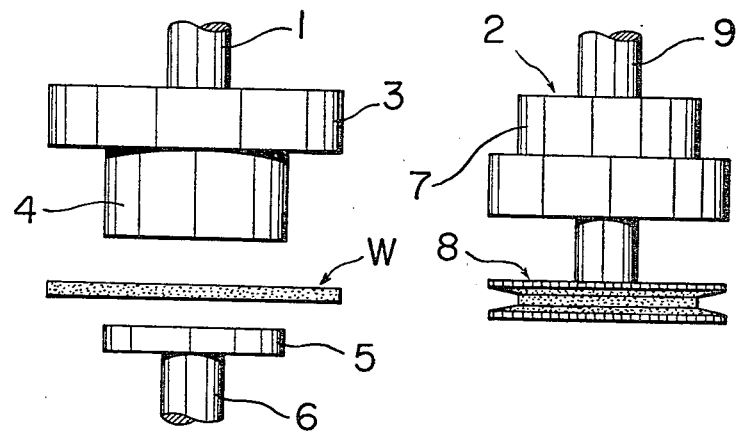
FIG. 1 is an elevational view of main part of the inventive apparatus for contour grinding.

In the method of the present invention, the rod-like single crystal of silicon semiconductor or GGG, which is called an ingot or boule, having a diameter ranging from several centimeters to 10 centimeters or larger, is first ground in the step (a) by use of a centerless grinder or other suitable grinding machines to such an extent that the ground rod has a cross section larger than the desired wafer after finishing by a margin to grind in the subsequent step (c). When the desired wafer products are circular having no orientation flat, then the single crystal rod ground in this step is also circular in axial cross section having a diameter, for example, 0.5 to 1.5 mm larger than the diameter of the desired wafer product. This margin to grind or grinding allowance is not particularly limitative but an excessively large margin to grind or grinding allowance is of course undesirable because of the increased stock removal in the subsequent step (c) whereas too small margins bring about difficulties in exact mounting of the margined wafer on the chucking holder.

When the finished wafer is desired to be provided with an orientation flat, the single crystal rod must be accordingly provided with a flat surface running in parallel with the axis of the rod by grinding with a planer or other suitable grinding machines. This flat surface is also parallel with orientation flat in the finished wafer products in consideration of a necessary crystal lattice orientation or other desired factors. The width of the flat surface also should be determined in consideration not to unduly increase the stock removal in the step (c) but not to unduly increase the difficulty in mounting the margined wafer on the chucking holder in the step (c).

The single crystal rod ground in the step (a) above to have a desired cross section is then sliced in the step (b) into wafers of desired thickness. The method of slicing as well as the slicing machine used for slicing such a rod-like body are rather conventional and need not be described here in detail. In the inventive method, however, an advantage is obtained that the speed of the slicing machine can be increased because small chipping at the edges of the wafers is of no matter in so far as the chipping is limited within the margin of the wafer to be removed in the subsequent step (c) by grinding.

The margined wafer obtained by slicing of the single crystal rod in the step (b) is then subjected to contour grinding. This step (c) of contour grinding is described in detail below with reference to the drawing annexed schematically illustrating the main part of the apparatus.

As is shown in FIG. 1, the margined wafer W is placed on the lower chucking member 5 which is rotatable by the shaft 6 around an axis. The upper surface of the lower chucking member 5 is flat and perpendicular to the axis of rotation so that the margined wafer W placed on the lower chucking member 5 is also laid flat perpendicularly to the axis of rotation. On to the surface of the wafer W placed on the lower chucking member 5 was then lowered an upper chucking member 4 having a flat bottom surface so as that the wafer W can be rotated as firmly held between the lower and the upper chucking members 5, 4.

Above the upper chucking member 4 was positioned a prototype 3 having exactly the same cross section in shape and dimensions as the desired wafer product after finishing and supported by the shaft 1. It is essential in this case that the prototype 3 and the chucking holder composed of the upper and lower chucking member 4, 5 are rotated coaxially at the same velocity. Most conveniently, the prototype 3 and the upper chucking member 4 are integrally mounted on the upper shaft 1 which is coaxial with the lower shaft 6.

The velocity of rotation of the chucking holder or the prototype 3, i.e. the upper and lower shafts 1, 6, should not be excessively high and preferably in the range from 2 r.p.m. to 30 r.p.m. or, preferably, from 5 r.p.m. to 20 r.p.m.

On the other hand, the apparatus is provided with a tracing grinder unit 2 composed of a tracer roller 7 and a grinder wheel 8 mounted on the shaft 9 rotating at a high speed. The axis of rotation of the shaft 9 is necessarily parallel with the axis of rotation of the shafts 1, 6. It is of course that the tracer roller 7 and the grinder wheel 8 are both coaxial with the shaft 9. It is also essential that the tracer roller 7 and the grinding surface of the grinder wheel 8 have the same diameter within the error permissible in the diameter of the finished wafer products.

Further, the shaft 9 is movable relatively toward and away from the shafts 1, 6 while continuously rotating at a high speed. The positions of the tracer roller 7 and the grinder wheel 8 along the shaft 9 are determined such that, when the shaft 9 is moved toward the shafts 1, 6, the peripheral surface of the tracer roller 7 comes into contact with the peripheral surface of the prototype 3 while the grinding surface of the grinder wheel 8 comes into contact with the marginal peripery of the margined wafer W so that the margin of the wafer W is removed by grinding with the grinder wheel 8.

When the tracing grinder unit 2 is pressed gently toward the shafts 1, 6, removal of the wafer margin by the grinder wheel 8 is continued until the movement of the shaft 9 is interrupted when the peripheral surface of the tracer roller 7 has come to contact with the peripheral surface of the prototype 3. Thus, the wafer W is finished to have exactly the same dimensions and shape as the prototype 3 with sufficient accuracy.

Figure 2:
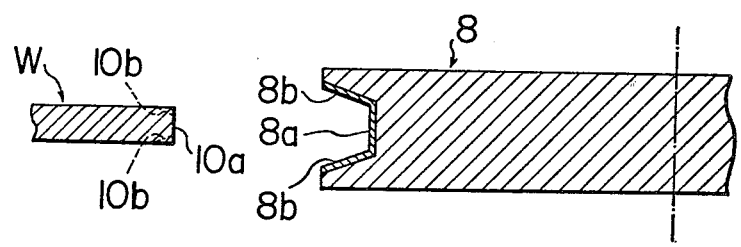
FIG. 2 is part of an enlarged axial cross section of the grinder wheel and a wafer.

When no chamfering is required in the finished wafer products, that is, when the peripheral surface of the wafer is a simple cylindrical surface, the grinding surface of the grinder wheel 8 also can be a mere cylindrical surface. As is mentioned before, however, the peripheral edges of wafer products are sometimes desired to be chamfered. In order to carry out such a work of chamfering it is convenient that the grinder wheel 8 has not only a cylindrical grinding surface 8a but also conical or tapered grinding surfaces 8b, 8b as is shown in FIG. 2 illustrating part of the enlarged radial cross section of the grinder wheel 8. In this case, the grinder wheel 8 is desirably movable in the axial direction of the shaft 9 though in a small range.

With the above described configuration of the grinder wheel 8, the margined wafer W is first ground with the cylindrical grinding surface 8a of the grinder wheel 8 so as to shape the cylindrical peripheral surface 10a of the wafer W with exact diameter by merely pressing the cylindrical grinding surface 8a against the margined wafer W. In the next place, the grinding wheel 8 is moved slightly relative to the wafer W in the axial direction of the shaft 9 so as that one of the conical grinding surfaces 8b, 8b comes into contact with one of the peripheral edges of the wafer W whereby effecting chamfering of the periphery of the wafer W to form the chamfered surface 10b. When one of the chamfered surfaces 10b, 10b has been finished in this way, the grinder wheel 8 is again moved in the reverse axial direction so that the other peripheral edge of the wafer W is ground with the other conical grinding surface 8b of the grinder wheel 8 to form the other chamfered surface 10b.

As is described above, the method and apparatus of the present invention provide an efficient means in which a wafer material is given not only a desired exact diameter and an orientation flat or orientation flats but also chamfered surfaces by a single mounting on the apparatus.

What is claimed is:

1. A method for shaping a wafer material with accurate dimensions from a single crystal rod which comprises the steps of
(a) grinding the single crystal rod so that the rod has a diameter 0.5 to 1.5 mm. larger than the finished wafer material as a grinding margin,
(b) slicing the single crystal rod into margined wafers, and
(c) subjecting the margined wafer to contour grinding tracing a prototype having a cross section exactly in conformity with the wafer material to be finished.

* * * * *